United States Patent [19]

Allen et al.

[11] Patent Number: 5,013,604
[45] Date of Patent: May 7, 1991

[54] PREPARATION OF HIGH PURITY BORON

[75] Inventors: Robert H. Allen; Jameel Ibrahim, both of Baton Rouge, La.

[73] Assignee: Ethyl Corporation, Richmond, Va.

[21] Appl. No.: 255,446

[22] Filed: Oct. 11, 1988

[51] Int. Cl.[5] .............................................. B32B 15/02
[52] U.S. Cl. .................................. 428/402; 428/357; 423/298
[58] Field of Search ................ 428/402, 401; 423/298, 423/DIG. 16; 427/255; 156/DIG. 86, 600, 620.5

[56] References Cited

U.S. PATENT DOCUMENTS 3,115,393 12/1963 Robb ..................................... 423/298

FOREIGN PATENT DOCUMENTS 1232558 1/1967 Fed. Rep. of Germany ...... 423/298
1480305 5/1967 France ................................. 423/298

OTHER PUBLICATIONS

Kirk-Othmer *Encyclopedia of Chemical Technology*, Third Edition, vol. IV, p. 65.

Primary Examiner—George F. Lesmes
Assistant Examiner—J. M. Gray
Attorney, Agent, or Firm—J. F. Sieberth; T. B. Morris

[57] ABSTRACT

Boron particles in bead-like form suitable for use in the preparation of doped, single crystal silicon can be prepared using a fluidized bed technique for chemical vapor deposition of a boron hydride, such as diborane or decaborane.

6 Claims, 1 Drawing Sheet

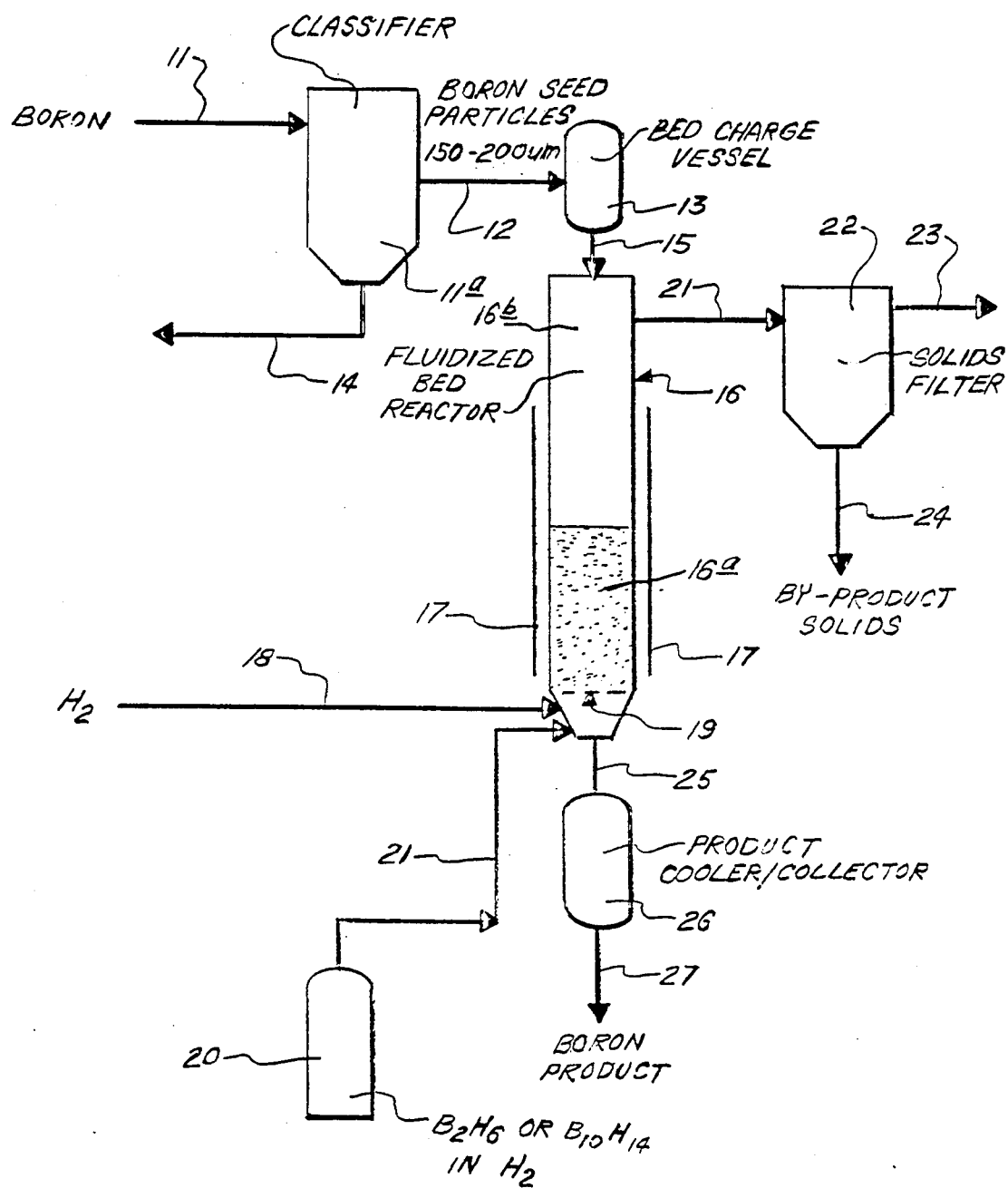

PREPARATION OF HIGH PURITY BORON

CROSS-REFERENCE TO RELATED APPLICATIONS

Reference is made to the following applications which have been filed by the inventors, and which relate to high purity dopant alloys comprising silicon and a p or n carrier element such as boron: application Ser. No. 126,203 filed Nov. 27, 1987, now U.S. Pat. No. 4,789,596, and applications Ser. Nos. 212,231, now U.S. Pat. No. 4,851,297, 212,286, now U.S. Pat. No. 4,952,425, and 212,290, all filed on June 27, 1988.

BACKGROUND OF THE INVENTION

This invention relates to high purity boron pellets, useful as dopants in the manufacture of single crystal, low resistivity, silicon ingots. Such ingots are starting materials for preparation of semiconductor devices. This invention also relates to a process for producing high purity boron in free-flowing, bead-like form.

Current methods for preparing electronic grade crystalline boron for doping, comprise decomposing boron halides in Siemens-type reactors. Operating temperatures are customarily within the range of 1,000° to 1,300° C. Such processes are energy intensive and inefficient, and corrosive by-products are produced. The boron product is in rod-like form.

The boron rods are customarily purified by float-zoning, or a similar technique. Such purifications comprise another energy intensive, high temperature process. After purification, the material is crushed, separated into desired particle sizes, and blended to produce the desired product. Impurities may be introduced during the crushing, size separation, and blending operations. Moreover, these steps have fairly significant yield losses.

Kirk-Othmer *Encyclopedia of Chemical Technology*, Third Edition, Volume IV, Page 65, says in part "Direct thermal decomposition of boron compounds to high purity boron is limited to halides and hydrides. Boron tribromide or triiodide, and boron hydrides (from diborane to decaborane) have been decomposed on a wide variety of substrates ranging from glass to tungsten at temperatures from 800°-1500° C."

SUMMARY OF THE INVENTION

This invention relates to high purity boron particles which are in bead-like form, and which are suitable for use as a dopant for producing low resistivity silicon single crystals. The invention also relates to a process for preparing these boron products. This process involves the use of fluidized bed technology, and is capable of producing high purity boron in the form of substantially uniform, approximately spherically shaped, free-flowing particles of a narrow size distribution. Although the products of this invention can be used in batch and continuous crystal pulling processes, the free-flowing nature of the product makes them eminently suitable for use in continuous and semi-continuous Czochralski systems for producing doped, electronic grade, silicon single crystals.

Special features of the process of this invention include:

(i) Use of high-purity boron hydrides, such as diborane and/or decaborane as the feed material. The decomposition takes place in a fluidized bed at approximately 500° to 600° C., i.e. at a temperature significantly below those employed in prior art processes.

(ii) Starting with a fluidized bed of high-purity boron seed particles, boron will be deposited on the particles until the desired product particle size is reached. Thus, crushing or similar technique is not required.

(iii) Hydrogen or another inert gas can be used to levitate the fluidized bed. Little or no corrosive by-product gas is produced. If desired, the reactor exit gases can be recycled with minimal purification.

(iv) The process can be extended to the use of high-purity silicon seed particles to prepare other useful products. Thus, silicon seeds can be used instead of boron seeds. In the case of silicon seeds, if they grow from an average size of 200 millimicrons to an average size of 700 millimicrons by the deposition of boron thereon, the silicon content of the product pellets will be about 2.3 percent, and the remainder of the products will be boron. Such materials are also useful as dopants.

A preferred process for producing boron particles of this invention comprises use of a batch-type fluidized bed reactor. The boron will be deposited on seed particles of a known, narrow particle size distribution until the desired pellet size is achieved. The material in the fluidized bed can be removed as a product, and used directly in the aforementioned crystal pulling processes as a dopant. This process has several advantages over the prior art production method discussed above:

(a) It is a much more energy efficient process, since it is conducted at lower temperature.
(b) Yields are higher.
(c) The product is produced in a single step.
(d) The product is produced as spherical or substantially spherical, free-flowing particles which are ideally suited for the aforementioned continuous or semi-continuous melt systems.
(e) The process does not have mechanical handling steps which are included within the prior art process, and which can compromise product purity.
(f) No, or substantially no corrosive by-product gases are produced.

BRIEF DESCRIPTION OF THE DRAWING

The figure is a schematic representation, partly in cross section and not to scale, of a fluidized bed reactor and attendant equipment in accordance with certain embodiments of this invention.

DESCRIPTION OF PREFERRED EMBODIMENTS

In a preferred embodiment, this invention comprises electronic grade boron in the form of free-flowing, bead-like particles, which is suitable for use in continuous and semi-continuous Czochralski systems for preparing doped, single crystal silicon, said particles having an average size within the range of from about 500 to about 700 microns, a size distribution of less than about 50 microns, and a purity of at least 99.9995 percent.

This invention also comprises a process for preparing electronic grade boron in the form of free-flowing, bead-like particles which is suitable for use in continuous and semi-continuous Czochralski systems for preparing doped, single crystal silicon, said process comprising contacting in a fluidized bed, (a) boron seed particles having a size within the range of from about 150 to about 200 millimicrons with (b) a gas comprising a thermally decomposable boron hydride, said seed particles being above the decomposition temperature of said hydride, whereby deposition of boron on said seed particles takes place until said particles have grown to an average size within the range of from about 500 to about 700 microns.

Referring now to the drawing, boron particles are transported through line 11 into classifier 11a. The classifier may comprise a sieve or other similar device for separating boron seed particles of a desired size range from boron particles of undesirable size. In the process, for example, the desired boron seed particles may have a diameter within the range of from about 150 to about 200 millimicrons. Such particles are taken from classifier 11a and through line 12 into charge vessel 13. Particles that are not within the desired size range are removed from classifier 11a via line 14.

As required, seed particles from vessel 13 are charged via line 15 into fluidized bed reactor 16. The seed particles charged to the reactor become part of fluidized particle bed 16a.

Gases and vapors flow into reactor 16 with sufficient motive force to maintain the particles in bed 16a in fluidized suspension. For this process, the principal levitating gas can be hydrogen. As shown in the drawing, hydrogen enters into reactor 16 through line 18 and distributor 19. The distributor has a plurality of orifices which facilitate equalized flow of gas through the fluidized bed. If desired, all or part of the hydrogen can be replaced with another inert gas, such as argon, neon, or the like.

A volatile boron compound such as diborane $B_2H_6$, or decaborane $B_{10}H_{14}$ is used as a boron source. Preferably, one or more of these volatile boron hydrides is included within a mixture of gases. Besides the boron source, the mixture comprises a carrier gas which can be hydrogen, neon, argon, or the like. Such a gas mixture is removed from storage vessel 20 via line 21, and introduced into the fluidized bed in reactor 16 through the apertures in distributor 19. As shown, the mixture of gases from vessel 20 is combined with the flow of motive gas (from line 18) prior to entry into reaction vessel 16 via distributor 19.

The combined gases and/or vapors flow through the fluidized bed. The particles in the bed are maintained at a temperature above the thermal decomposition temperature of the boron source(s) employed. For this purpose, the particle bed is heated by external heater 17. In the process, the boron source(s) contact the particles within the bed, and boron is deposited on the particles via chemical vapor deposition. This deposition provides the growth in particle size utilized in the process of the invention.

Off gases and any solid by-products suspended therein leave the bed, enter the reactor free space 16b, and are removed from the reactor via line 21. From that line, they are introduced into solids filter 22. Off gases, with suspended solids removed, exit the filter via line 23. Any by-product solids collected by the filter can be discharged via line 24.

Product from reactor 16 is removed via line 25 to product cooler/collector 26. As required, boron product of this invention is removed from cooler/collector 26 via line 27.

For this invention, any boron hydride which is thermally decomposable upon heating can be used as the boron source. As indicated above, diborane and decaborane are suitable.

Seed particles of boron are used for a substrate on which boron is deposited by chemical vapor deposition. Preferably, the boron seeds have a size distribution within the range of about 100 to about 250 millimicrons; more preferably, from 150 to 200 millimicrons.

In order to deposit boron on the seed particles, it is necessary to heat the particles to a temperature above the decomposition temperature of the boron hydride which is used as a boron source. Preferably, the temperature is from about 500° to about 800° C.; more preferably, from about 500° to about 600° C.

As indicated above, products of this invention are produced by deposition of boron by passage of a boron-containing gas or vapor through a bed of fluidized particles heated to a temperature above a decomposition temperature of the boron source. Typically, the boron source is admixed with a gas prior to passage through the bed of fluidized particles. Hydrogen is a typical diluent gas; however, other inert gases such as mentioned above can also be used. The diluent gas has many advantages. For example, it dilutes the boron compound or compounds that are to be thermally decomposed, and thereby promotes good mixing with the bed particles. It also provides motive force to maintain the particles in fluidized suspension.

For the purpose of this invention, the boron hydride in hydrogen concentration flowing through the fluidized bed is preferably in the range of 1 to 30 mole percent, more preferably, about 5 to about 15 mole percent.

The exact conditions utilized to deposit the boron are important but not critical. Generally, it is desirable to use good fluidized bed process techniques, as they apply to the equipment being used, and the nature and type of product to be prepared. For commercial operations, the objective to prepare the product at acceptable cost should also be borne in mind.

The preferred process pressure is ambient pressure, but higher or lower pressures can be employed if desired. The flow of gases will be selected to maintain the bed of particles in an fluidized state. A flow rate (U), at or slightly above the minimum flow rate ($U_{min}$) required to keep the bed in a fluidized state will be used. Typically, the rate of flow can be defined by the relationship $U/U_{min} = 1.05$ to 3.0. Somewhat higher or lower rates can be used.

Products of this invention preferably have a relatively small size distribution, i.e. about 100–150 millimicrons. Preferred products have a diameter within the range of 500 to 700 microns. Products slightly outside this size range are also useful, and can be produced if desired.

To illustrate this invention, and not to limit it, a desirable product of this invention can be produced by using a fluidized bed of boron particles having a particle size distribution within the range of 150 to 200 microns. Typical product particles are free flowing, and have a size within the range of 500 to 700 microns. Illustrative but non-limiting operating conditions are:

| | |
|---|---|
| bed temperature | 500° to 600° C. |
| feed gas temperature | 325° to 375° C. |
| $U/U_{min}$ | 1.05 to 3.5 |
| boron hydride concentration in feed gas | 5 to 10 mole percent |

Preferred products will have a size distribution of less than 50 microns, and a boron purity of at least 99.9995 percent.

Having the above description of the invention and preferred embodiments thereof, a skilled practitioner may make changes, alterations, or substitutions without departing from the scope and spirit of the appended claims.

We claim:

1. Electronic grade boron in the form of free-flowing, bead-like particles, and suitable for use in continuous and semi-continuous Czochralski systems for preparing doped, single crystal silicon, said particles having an average size within the range of from about 500 to about 700 microns, a size distribution of less than about 100–150 microns, and a purity of at least 99.9995 percent.

2. Diborane-derived boron of claim 1.

3. Decaborane-derived boron of claim 1.

4. A process for preparing electronic grade boron in the form of free-flowing, bead-like particles which are suitable for use in continuous and semi-continuous Czochralski systems for preparing doped, single crystal silicon, said process comprising contacting in a fluidized bed, (a) boron seed particles having a size within the range of from about 150 to about 200 millimicrons with (b) a gas comprising a thermally decomposable boron hydride, said seed particles being above the decomposition temperature of said hydride, whereby deposition of boron on said seed particles takes place until said particles have grown to an average size within the range of from about 500 to about 700 microns.

5. The process of claim 4 wherein said boron hydride is diborane.

6. The process of claim 4 wherein said boron hydride is decaborane.

* * * * *